(12) United States Patent
Srivastava et al.

(10) Patent No.: US 6,621,211 B1
(45) Date of Patent: Sep. 16, 2003

(54) WHITE LIGHT EMITTING PHOSPHOR BLENDS FOR LED DEVICES

(75) Inventors: Alok Mani Srivastava, Niskayuna, NY (US); Holly Ann Comanzo, Niskayuna, NY (US); Thomas Francis McNulty, Ballston Lake, NY (US)

(73) Assignee: General Electric Company, Schenectady, NY (US)

(*) Notice: Subject to any disclaimer, the term of this patent is extended or adjusted under 35 U.S.C. 154(b) by 0 days.

(21) Appl. No.: 09/570,932

(22) Filed: May 15, 2000

(51) Int. Cl.$^7$ .................................................. H01J 33/00
(52) U.S. Cl. ..................... 313/503; 313/512; 313/499; 257/98; 257/103
(58) Field of Search ............................... 313/512, 498, 313/499, 501, 503; 428/917; 252/301.6 S, 301.6 P, 301.4 P, 301.4 S; 257/79, 98, 102, 103

(56) References Cited

U.S. PATENT DOCUMENTS

| | | | |
|---|---|---|---|
| 4,661,419 A | 4/1987 | Nakamura | 428/691 |
| 5,198,679 A | 3/1993 | Katoh et al. | 250/484.1 |
| 5,571,451 A | 11/1996 | Srivastava et al. | 252/301.4 |
| 5,813,753 A | 9/1998 | Vriens et al. | 362/293 |
| 5,847,507 A | 12/1998 | Butterworth et al. | 313/512 |
| 5,851,063 A | 12/1998 | Doughty et al. | 362/231 |
| 5,925,897 A | 7/1999 | Oberman | 257/80 |
| 5,966,393 A | 10/1999 | Hide et al. | 372/23 |
| 5,998,925 A | 12/1999 | Shimizu et al. | 313/503 |
| 6,066,861 A | 5/2000 | Höhn et al. | 257/99 |
| 6,069,440 A | 5/2000 | Shimizu et al. | 313/486 |
| 6,084,250 A | 7/2000 | Jüstel et al. | |
| 6,252,254 B1 * | 6/2001 | Soules et al. | 313/501 |
| 6,294,800 B1 * | 9/2001 | Duggel et al. | 313/504 |
| 6,299,338 B1 * | 10/2001 | Levinson et al. | 362/559 |
| 6,429,583 B1 * | 8/2002 | Levinson et al. | 313/503 |

FOREIGN PATENT DOCUMENTS

JP 183408 6/2000

OTHER PUBLICATIONS

Keith Butler: Fluorescent Lamp Phosphors, pp. 98–107 (The Pennsylvania State University Press 1980).
S. Nakamura et al.: The Blue Laser Diode, pp. 216–221, 328–329 (Springer 1997).
G. Blasse et al.: Luminescent Materials, pp. 109–110 (Springer–Verlag 1994).
A.L.N. Stevels et al.: $Eu^{2+} \rightarrow Mn^{2+}$ Energy Transfer In Hexagonal Aluminates, pp. 207–218 (Journal of Luminescence 14 (1976)).
S.M.J. Smets et al.: The Luminescence Properties of .: $Eu^{2+-}$ and $Mn^{2+}$–Doped Barium Hexaaluminates pp. 1305–1310 (Materials Research Bulletin, vol. 21, No. 11 (1986)).

(List continued on next page.)

*Primary Examiner*—Ashok Patel
(74) *Attorney, Agent, or Firm*—Foley & Lardner

(57) ABSTRACT

There is provided white light illumination system including a radiation source, a first luminescent material having a peak emission wavelength of about 575 to about 620 nm, a second luminescent material having a peak emission wavelength of about 495 to about 550 nm, which is different from the first luminescent material and a third luminescent material having a peak emission wavelength of about 420 to about 480 nm, which is different from the first and second luminescent materials. The LED may be a UV LED and the luminescent materials may be a blend of three or four phosphors. The first phosphor may be an orange emitting $Eu^{2+}$, $M^+$ activated strontium pyrophosphate, $Sr_2P_2O_7:Eu^{2+}$, $Mn^{2+}$. The second phosphor may be a blue-green emitting $Eu^{2+}$ activated barium silicate, $(Ba,Sr,Ca)_2SiO_4:Eu^{2+}$. The third phosphor may be a blue emitting SECA phosphor, $(Sr,Ba,Ca)_5(PO_4)_3Cl:Eu^{2+}$. Optionally, the fourth phosphor may be a red emitting $Mn^{4+}$ activated magnesium fluorogermanate, $3.5MgO*0.5MgF_2*GeO_2:Mn^{4+}$. A human observer perceives the combination of the orange, blue-green, blue and/or red phosphor emissions as white light.

26 Claims, 3 Drawing Sheets

OTHER PUBLICATIONS

J.M.P.J. Verstegen: A Survey of a Group of Phosphors, Based on Hexagonal Aluminate and Gallate Host Lattices, pp. 1623–1627 (Journal of the Electrochemical Society, vol. 121, No. 12 (1974)).

C.R. Ronda: Chemical Composition of and $Eu^{2+}$ Luminescence in the Barium Hexaaluminates, pp. 570–573 (Journal of the Electrochemical Society vol. 136, No. 2 (1989)).

A.L.N. Stevels et al.: $Eu^{2+}$ Luminescence in Hexagonal Aluminates Containing Large Divalent or Trivalent Cations, pp. 691–697 (Journal of the Electrochemical Society, vol. 123, No. 5 (1976).

G. Blasse et al.: Fluorescence of Eu2+–Activated Alkaline–Earth Aluminates, pp. 201–206 (Philips Res. Repts 23 (1968)).

G. Blasse et al.: Fluorescence of Eu2+–Activated Silicates, pp. 189–200 (Philips Res. Repts 23 (1968)).

S. Shionoya et al: Phosphor Handbook, pp. 168–170, 317–330, 343–349, 389–410, 412–417, 419–431, 554–555, 623–636, 727, 809 (Phosphor Research Society (1998)).

\* cited by examiner luminescent material

WHITE LIGHT EMITTING PHOSPHOR BLENDS FOR LED DEVICES

STATEMENT REGARDING FEDERALLY SPONSORED RESEARCH OR DEVELOPMENT

The U.S. Government may have certain rights in this invention pursuant to grant number 70NANB4022 from the NIST.

BACKGROUND OF THE INVENTION

This invention relates generally to a white light illumination system, and specifically to a ceramic phosphor blend for converting UV radiation emitted by a light emitting diode ("LED") to white light.

White light emitting LEDs are used as a backlight in liquid crystal displays and as a replacement for small conventional lamps and fluorescent lamps. As discussed in chapter 10.4 of "The Blue Laser Diode" by S. Nakamura et al., pages 216–221 (Springer 1997), incorporated herein by reference, white light LEDs are fabricated by forming a ceramic phosphor layer on the output surface of a blue light emitting semiconductor LED. Conventionally, the blue LED is an InGaN single quantum well LED and the phosphor is a cerium doped yttrium aluminum garnet ("YAG:Ce"), $Y_3Al_5O_{12}:Ce^{3+}$. The blue light emitted by the LED excites the phosphor, causing it to emit yellow light. The blue light emitted by the LED is transmitted through the phosphor and is mixed with the yellow light emitted by the phosphor. The viewer perceives the mixture of blue and yellow light as white light.

However the blue LED—YAG:Ce phosphor white light illumination system suffers from the following disadvantages. The prior art blue LED—YAG:Ce phosphor system produces white light with a high color temperature ranging from 6000 K to 8000 K, which is comparable to sunlight, and a typical color rendering index (CRI) of about 70 to 75. In other words, the chromaticity or color coordinates of this system are located adjacent to the Black Body Locus ("BBL") between the color temperatures of 6000 K and 8000 K on the CIE chromaticity diagram illustrated in FIG. 1. The color temperature of this system can be reduced by increasing the phosphor thickness. However, the increased phosphor thickness decreases the system efficiency.

While the blue LED—YAG:Ce phosphor illumination system with a relatively high color temperature and a relatively low CRI is acceptable to customers in the far east lighting markets, the customers in the North American markets generally prefer an illumination system with a lower color temperature, while the customers European markets generally prefer an illumination system with a high CRI. For example, North American customers generally prefer systems with color temperatures between 3000 K and 4100 K, while European customers generally prefer systems with a CRI above 90.

The chromaticity coordinates and the CIE chromaticity diagram illustrated in FIG. 1 are explained in detail in several text books, such as pages 98–107 of K. H. Butler, "Fluorescent Lamp Phosphors" (The Pennsylvania State University Press 1980) and pages 109–110 of G. Blasse et al., "Luminescent Materials" (Springer-Verlag 1994), both incorporated herein by reference. The chromaticity coordinates (i.e., color points) that lie along the BBL obey Planck's equation: $E(\lambda)=A\lambda^{-5}/(e^{(B/T)}-1)$, where E is the emission intensity, $\lambda$ is the emission wavelength, T the color temperature of the black body and A and B are constants. Color coordinates that lie on or near the BBL yield pleasing white light to a human observer. CRI is a relative measurement of how the color rendition of an illumination system compares to that of a black body radiator. The CRI equals 100 if the color coordinates of a set of test colors being illuminated by the illumination system are the same as the coordinates of the same test colors being irradiated by the black body radiator.

Another disadvantage of the blue LED—YAG:Ce phosphor system is that the LED color output (e.g., spectral power distribution and peak emission wavelength) varies with the band gap width of the LED active layer and with the power applied to the LED. During production, a certain percentage of LEDs are manufactured with active layers whose actual band gap width is larger or smaller than the desired width. Thus, the color output of such LEDs deviates from the desired parameters. Furthermore, even if the band gap of a particular LED has the desired width, during LED operation the power applied to the LED frequently deviates from the desired value. This also causes the LED color output to deviate from the desired parameters. Since the light emitted by the system contains a blue component from the LED, if the color output of the LED deviates from the desired parameters, then the light output by the system deviates form the desired parameters as well. A significant deviation from the desired parameters may cause the color output of the system to appear non-white (i.e., bluish or yellowish).

Furthermore, the color output of the blue LED—YAG:Ce phosphor system varies greatly due to frequent, unavoidable, routine deviations from desired parameters (i.e., manufacturing systematic variations) during the production of the LED lamp because the color output of this system is very sensitive to the thickness of the phosphor. If the phosphor is too thin, then more than a desired amount of the blue light emitted by the LED will penetrate through the phosphor, and the combined LED—phosphor system light output will appear bluish, because it is dominated by the output of the blue LED. In contrast, if the phosphor is too thick, then less than a desired amount of the blue LED light will penetrate through the thick YAG:Ce phosphor layer. The combined LED—phosphor system will then appear yellowish, because it is dominated by the yellow output of the YAG:Ce phosphor.

Therefore, the thickness of the phosphor is a critical variable affecting the color output of the prior art system. Unfortunately, it is difficult to control the precise thickness of the phosphor during large scale production of the blue LED—YAG:Ce phosphor system. Variations in phosphor thickness often result in the system output being unsuitable for white light illumination applications, causing the color output of the system to appear non-white (i.e., bluish or yellowish), which leads to an unacceptably low blue LED—YAG:Ce phosphor system manufacturing yield.

The blue LED—YAG:Ce phosphor system also suffers from the halo effect due to the separation of blue and yellow light. The LED emits blue light in a directional fashion. However, the phosphor emits yellow light isotropically (i.e., in all directions). Therefore, when the light output by the system is viewed straight on (i.e., directly at the LED emission), the light appears bluish-white. In contrast, when the light output is viewed at an angle, the light appears yellowish due to the predominance of the yellow phosphor emission. When the light output by such a system is directed onto a flat surface, it appears as a yellowish halo surrounding a bluish area. The present invention is directed to overcoming or at least reducing the problems set forth above.

BRIEF SUMMARY OF THE INVENTION

In accordance with one aspect of the present invention, there is provided a white light illumination system comprising a light emitting diode, a first luminescent material having a peak emission wavelength of about 575 to about 620 nm, a second luminescent material having a peak emission wavelength of about 495 to about 550 nm, which is different from the first luminescent material, and a third luminescent material having a peak emission wavelength of about 420 to about 480 nm, which is different from the first and second luminescent materials.

In accordance with another aspect of the present invention, there is provided a white light emitting phosphor blend comprising at least three phosphors, wherein the white light emitted by the phosphor blend in response to incident radiation having a peak wavelength between 360 and 420 nm comprises a color temperature between 3000 K and 6500 K, a CRI above 70 and an efficacy above 200 lm/W.

In accordance with another aspect of the present invention, there is provided a white light illumination system, comprising:

a radiation source;

a first APO:$Eu^{2+}$,$Mn^{2+}$ phosphor, where A comprises at least one of Sr, Ca, Ba or Mg;

a second phosphor selected from at least one of:
  a) an ASiO:$Eu^{2+}$ phosphor, where A comprises at least one of Ba, Ca, Sr or Mg;
  b) an ADSiO:$Eu^{2+}$ phosphor, where A comprises at least one of Ba, Ca or Sr and D comprises at least one of Mg or Zn; or
  c) an AAlO:$Eu^{2+}$ phosphor, where A comprises at least one of Ba, Sr or Ca; and a third phosphor selected from at least one of:
  d) an AMgAlO:$Eu^{2+}$ phosphor where A comprises at least one of Ba, Ca or Sr;
  e) a DPOCl:$Eu^{2+}$ phosphor where D comprises at least one of Sr, Ba, Ca or Mg;
  f) an EO*AlO:$Eu^{2+}$ phosphor, where E comprises at least one of Ba, Sr or Ca;
  g) an EAlO:$Eu^{2+}$ phosphor, where E comprises at least one of Ba, Sr or Ca; or
  h) GAlO:$Eu^{2+}$ phosphor, where G comprises at least one of K, Li, Na or Rb.

In accordance with another aspect of the present invention, there is provided a method of making a white light illumination system, comprising blending a first phosphor powder having a peak emission wavelength of about 575 to about 620 nm, a second phosphor powder having a peak emission wavelength of about 495 to about 550 nm, and a third phosphor powder having a peak emission wavelength of about 420 to about 480 nm to form a phosphor powder mixture, and placing the phosphor powder mixture into the white light illumination system adjacent a light emitting diode.

DETAILED DESCRIPTION OF THE INVENTION

Figure 1:
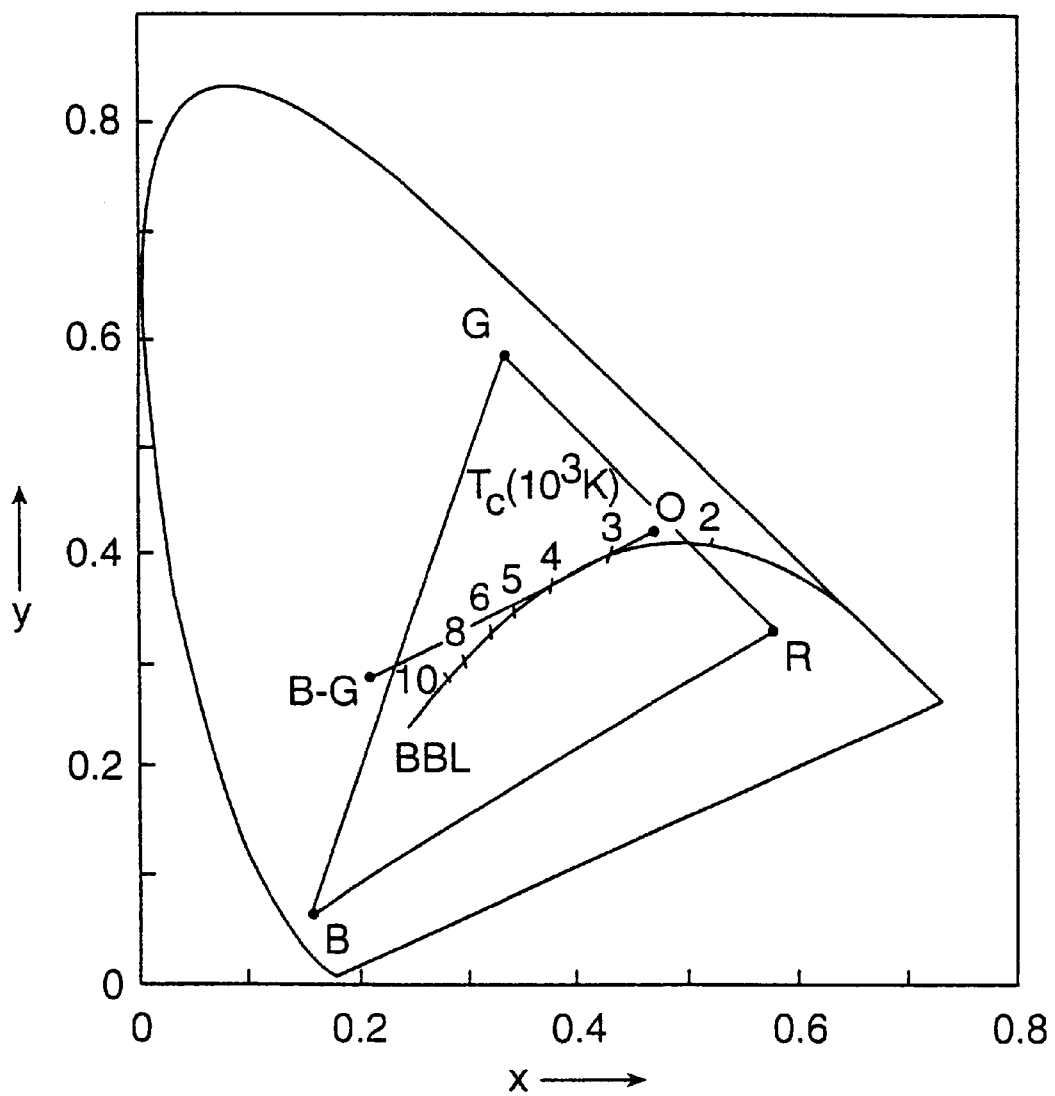
FIG. 1 is an illustration of a CIE chromaticity diagram.

In view of the problems in the prior art, it is desirable to obtain a white light illumination system whose color output is less sensitive to variations during system operation and manufacturing process, such as due to variations in the LED power, the width of the LED active layer band gap and the thickness of the luminescent material. The present inventors have discovered that a color output of the radiation source— luminescent material system is less sensitive to these variations if the color output of the system does not include significant visible radiation emitted by the radiation source, such as an LED. In this case, the color output of the system does not vary significantly with the LED power, band gap width and the luminescent material thickness. The term luminescent material preferably comprises a phosphor in loose or packed powder form.

The color output of the system does not vary significantly with the thickness of the luminescent material if the white light emitted by the system lacks any significant visible component emitted by the radiation source, such as the LED. Therefore, the amount of transmission of the LED radiation through the luminescent material, such as a phosphor, does not affect the color output of the system. This can be achieved in at least two ways.

One way to avoid affecting the color output of the system is by using a radiation source that emits radiation in a wavelength that is not visible to the human eye. For example, an LED may be constructed to emit ultraviolet (UV) radiation having a wavelength of 380 nm or less that is not visible to the human eye. Furthermore, the human eye is not very sensitive to UV radiation having a wavelength between 380 and 400 nm and to violet light having a wavelength between 400 and 420 nm. Therefore, the radiation emitted by the LED having a wavelength of 420 nm or less would not substantially affect the color output of the LED—phosphor system irrespective of whether the emitted LED radiation is transmitted through the phosphor or not, because radiation having a wavelength of about 420 nm or less is not significantly visible to a human eye.

The second way to avoid affecting the color output of the system is by using a thick luminescent material which does not allow the radiation from the radiation source to pass through it. For example, if the LED emits visible light between 420 and 650 nm, then in order to ensure that the phosphor thickness does not affect the color output of the system, the phosphor should be thick enough to prevent any significant amount of visible light emitted by the LED from penetrating through the phosphor. However, while this way to avoid affecting the color output of the system is possible, it is not preferred because it lowers the output efficiency of the system.

In both cases described above, the color of the visible light emitted by the system is solely dependent on the type of luminescent material used. Therefore, in order for the LED—phosphor system to emit white light, the phosphor should emit white light when it is irradiated by the LED radiation.

Furthermore, by utilizing more than one phosphor the color properties of the white light may be varied to meet the desired color parameters. For example, by selecting certain phosphors in a certain ratio, the color temperature and the CRI of the white light or the efficacy of the system may be optimized. For example, phosphor ratios may be selected to obtain a white light illumination system with a color temperature of 3000 K to 6500 K, a CRI of above 70 and an efficacy of above 300 lm/W, which is desirable in the North American markets. A color temperature of 4000 to 6500 K is particularly desirable for a flashlight. Alternatively, other phosphor ratios may be selected to obtain a white light illumination system with a color temperature of 3000 K to 4100 K, a CRI of above 90 and an efficacy of above 200 lm/W, which is desirable in the European markets.

The present inventors have discovered that a when a first orange emitting phosphor having a peak emission wavelength between about 575 and 620 nm, a second blue-green emitting phosphor having a peak emission wavelength between about 495 to about 550 nm, and a third blue emitting phosphor having a peak emission wavelength of about 420 to about 480 are used together, a human observer perceives their combined emission as white light. Furthermore, in order to increase the CRI of the illumination system, a fourth red emitting phosphor having a peak emission wavelength of about 620 nm to about 670 nm may be optionally added.

Figure 2:
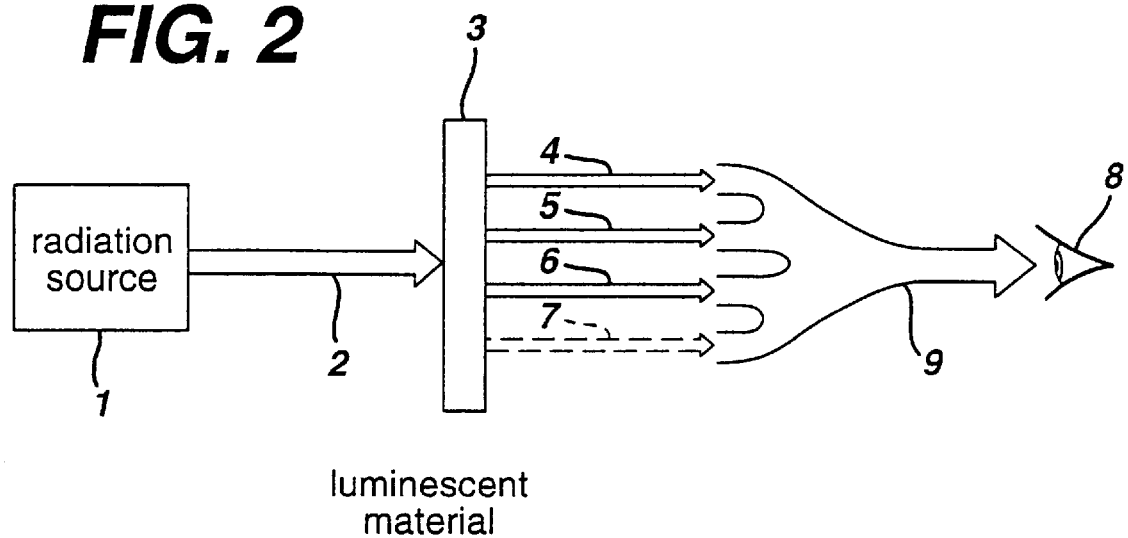
FIG. 2 is schematic illustration of a white light illumination system according to one embodiment of the present invention.

FIG. 2 schematically illustrates the above principle. In FIG. 2, a radiation source 1, such as an LED, emits radiation 2 incident on three luminescent materials layers 3, such as the above described first, second and third phosphors. The radiation 2 may have a wavelength to which the human eye is not sensitive, such as 420 nm and below. Alternatively, the phosphors 3 may be too thick to allow significant radiation 2 to penetrate to the other side. After absorbing the incident radiation 2, the first phosphor emits orange light 4 having a peak emission wavelength between 575 and 620 nm, the second phosphor emits blue-green light 5 having a peak emission wavelength between 495 and 550 nm, and the third phosphor emits blue light 6 having a peak emission wavelength between 420 and 480. If present, the fourth phosphor emits red light 7 having a peak emission wavelength between 620 nm and 670 nm. The human observer 8 perceives the combination of the orange 4, blue-green 5, blue 6 and optionally red 7 light as white light 9. FIG. 2 schematically illustrates that different color light 4, 5, 6, 7 emanates from discrete phosphor areas to illustrate the concept of color mixing. However, it should be understood that light 4, 5, 6 and 7 may be emitted from the same area and/or from the entire phosphor if the individual phosphors are blended together to form a single blended phosphor layer 3.

Any luminescent materials, such as phosphors and scintillators may be used in combination with a radiation source to form the white light illumination system. Preferably, the luminescent materials have a high quantum efficiency at a particular emission wavelength of the radiation source. Furthermore, each luminescent material is preferably transparent to the visible light wavelengths emitted by the other luminescent material.

1. The Radiation Source

The radiation source I may comprise any radiation source capable of causing an emission from the phosphors. Preferably, the radiation source 1 comprises an LED. However, the radiation source 1 may also comprise a gas, such as mercury in a fluorescent lamp or high pressure mercury vapor lamp, or a noble gas, such as Ne, Ar and/or Xe in a plasma display.

For example, the radiation source 1 may comprise any LED which causes the phosphors 3 to emit radiation 9 which appears white to the human observer 8 when the radiation 2 emitted by the LED is directed onto the phosphors. Thus, the LED may comprise a semiconductor diode based on any suitable III–V, II–VI or IV–IV semiconductor layers and having an emission wavelength of 360 to 420 nm. For example, the LED may contain at least one semiconductor layer based on GaN, ZnSe or SiC semiconductors. The LED may also contain one or more quantum wells in the active region, if desired. Preferably, the LED active region may comprise a p-n junction comprising GaN, AlGaN and/or InGaN semiconductor layers. The p-n junction may be separated by a thin undoped InGaN layer or by one or more InGaN quantum wells. The LED may have an emission wavelength between 360 and 420 nm, preferably between 370 and 405 nm, most preferably between 370 and 390 nm. However, an LED with an emission wavelength above 420 nm may be used with a thick phosphor, whose thickness prevents the light emitted from the LED from penetrating through the phosphor. For example the LED may have the following wavelengths: 370, 375, 380, 390 or 405 nm.

The radiation source 1 of the white light illumination system has been described above as a semiconductor light emitting diode. However, the radiation source of the present invention is not limited to a semiconductor light emitting diode. For example, the radiation source may comprise a laser diode or an organic light emitting diode (OLED). The preferred white light illumination system described above contains a single radiation source 1. However, if desired, plural radiation sources may be used in the system in order to improve the emitted white light or to combine the emitted white light with a light of a different color(s). For example, the white light emitting system may be used in combination with red, green and/or blue light emitting diodes in a display device.

2. The First Phosphor

The first luminescent material may be any phosphor, which in response to the incident radiation 2 from the radiation source 1, emits visible light having a peak emission wavelength of about 575 to about 620 nm. If the radiation source 1 comprises an LED having a peak emission wavelength between 360 and 420 nm, then the first phosphor may comprise any commercially available phosphor having the peak emission wavelength between 575 and 620 nm and a high relatively efficacy and quantum efficiency for incident radiation having a peak wavelength between 360 and 420 nm.

Preferably, the first phosphor comprises $APO:Eu^{2+},Mn^{2+}$, where A comprises at least one of Sr, Ca, Ba or Mg. Most preferably, the first phosphor comprises a europium and manganese doped alkaline earth pyrophosphate phosphor, $A_2P_2O_7:Eu^{2+},Mn^{2+}$. The phosphor may be written as $(A_{1-x-y}Eu_xMn_y)_2P_2O_7$, where $0<x\leq0.2$, and $0<y\leq0.2$. Preferably, A comprises strontium ions. This phosphor is preferred for an LED radiation source because it has a high efficacy and high quantum efficiency for incident radiation having a peak wavelength between 360 and 420 nm, such as that emitted by an LED. Alternatively, the first phosphor may comprise $A_3P_2O_8:Eu^{2+},Mn^{2+}$, where A comprises at least one of Sr, Ca, Ba or Mg.

In the $Eu^{2+}$ and $Mn^{2+}$ doped alkaline earth pyrophosphate phosphor, the Eu ions generally act as sensitizers and Mn ions generally act as activators. Thus, the Eu ions absorb the incident energy (i.e., photons) emitted by the radiation source and transfer the absorbed energy to the Mn ions. The Mn ions are promoted to an excited state by the absorbed transferred energy and emit a broad radiation band having a peak wavelength that varies from about 575 to 595 nm when the A ions comprise Sr ions. Alternatively, A may comprise 50 molar percent Sr ions and 50 molar percent Mg ions, such that the APO:$Eu^{2+}$,$Mn^{2+}$ phosphor comprises a SrMg$P_2O_7$:$Eu^{2+}$,$Mn^{2+}$ phosphor which has a peak wavelength of about 615 nm.

3. The Second Phosphor

The second luminescent material may be any phosphor, which in response to the incident radiation 2 from the radiation source 1, emits visible light having a peak emission wavelength of about 495 nm to about 550 nm. If the radiation source 1 comprises an LED having a peak emission wavelength between 360 and 420 nm, then the second phosphor may comprise any commercially available phosphor having the peak emission wavelength between 495 and 550 nm and a high relatively efficacy and quantum efficiency for incident radiation having a peak wavelength between 360 and 420 nm. For example, the following three $Eu^{2+}$ activated alkaline earth silicate and alkaline earth aluminate phosphors fit this criteria.

One such phosphor is a divalent europium activated alkaline earth silicate phosphor, ASiO:$Eu^{2+}$, where A comprises at least one of Ba, Ca, Sr or Mg. Preferably, the ASiO:$Eu^{2+}$ phosphor has the following composition: $A_2SiO_4$:$Eu^{2+}$, where A preferably comprises at least 60% Ba, 30% or less Sr and 10% or less Ca. If A comprises Ba or Ca, then the phosphor peak emission wavelength is about 505 nm. If A comprises Sr, then the phosphor peak emission wavelength is about 580 nm. Therefore, A most preferably comprises Ba ions or Ba ions with some Ca and/or Sr ions to obtain a desired peak wavelength.

In the alkaline earth silicate phosphor, the europium activator substitutes on the alkaline earth lattice site, such that the phosphor may be written as: $((Ba,Sr,Ca)_{1-x}Eu_x)_2SiO_4$, where $0<x\leq0.2$. The alkaline earth silicate phosphor may also contain other impurities and dopants. For example, the phosphor may contain a small amount of fluorine incorporated during powder processing from a fluorine containing flux compound, such as $BaF_2$ or $EuF_3$.

Another divalent europium activated alkaline earth silicate phosphor, ADSiO:$Eu^{2+}$ where A comprises at least one of Ba, Ca or Sr and D comprises at least one of Mg and Zn, is suitable as the second phosphor. Preferably, the ADSiO:$Eu^{2+}$ phosphor has the following composition: $A_2DSi_2O_7$:$Eu^{2+}$. The peak emission wavelength and the relative quantum efficiency of each isomorphous phosphor is illustrated in Table I below:

A divalent europium activated alkaline earth aluminate phosphor, AAlO:$Eu^{2+}$, where A comprises at least one of Ba, Sr or Ca is also suitable for use as the second phosphor. Preferably, the AAlO:$Eu^{2+}$ phosphor has the following composition: $AAl_2O_4$:$Eu^{2+}$, where A comprises at least 50% Sr, preferably at least 80% Sr and 20% or less Ba. If A comprises Ba, then the phosphor peak emission wavelength is about 505 nm. If A comprises Sr, then the phosphor peak emission wavelength is about 520 nm. If A comprises Ca, then the phosphor peak emission wavelength is about 440 nm. Therefore, A most preferably comprises Sr or Sr and Ba ions in order to obtain the desired peak wavelength.

In the alkaline earth aluminate phosphor, the europium activator substitutes on the alkaline earth lattice site, such that the phosphor may be written as: $(A_{1-x}Eu_x)Al_2O_4$, where $0<x\leq0.2$. The alkaline earth aluminate phosphor may also contain other impurities and dopants, such as fluorine incorporated from a flux.

The europium activated alkaline earth silicate phosphors are described in detail in G. Blasse et al., "*Fluorescence of $Eu^{2+}$ Activated Silicates*" 23 Philips Res. Repts. 189–200 (1968), incorporated herein by reference. The europium activated alkaline earth aluminates phosphors are described in detail in G. Blasse et al., "*Fluorescence of $Eu^{2+}$ Activated Alkaline-Earth Aluminates*" 23 Philips Res. Repts. 201–206 (1968), incorporated herein by reference. These references also illustrate the emission and excitation spectra of the above described phosphors.

In one aspect of the present invention, the second phosphor may comprise a plurality of the silicate and aluminate phosphors in order to optimize the color or other emission properties, if desired. For example, the second phosphor may comprise the following combinations: ASiO:$Eu^{2+}$ and ADSiO:$Eu^{2+}$, ASiO:$Eu^{2+}$ and AAlO:$Eu^{2+}$, ADSiO:$Eu^{2+}$ and AAlO:$Eu^{2+}$, ASiO:$Eu^{2+}$ and ADSiO:$Eu^{2+}$ and AAlO:$Eu^{2+}$. The above mentioned phosphors may be placed into the same illumination system as overlying layers or as a blend.

4. The Third Phosphor

The third luminescent material may be any phosphor, which in response to the incident radiation 2 from the radiation source 1, emits visible light having a peak emission wavelength of about 420 nm to about 480 nm. If the radiation source 1 comprises an LED having a peak emission wavelength between 360 and 420 nm, then the third phosphor may comprise any commercially available phosphor having the peak emission wavelength between 420 and

TABLE I

| A | D | A | D | A | D | A Sr/Ba | D Mg | A Ba | D Mg | A Ba | D Zn |
| Ca | Mg | Sr | Mg | Sr | Zn | | | | | | |
|---|---|---|---|---|---|---|---|---|---|---|---|
| Peak λ 535 | | 470 | | 470 | | 440 | | 500 | | 505 | |

Therefore, A most preferably comprises Ba ions and/or Ba ions with some Ca or Sr ions in order to obtain the desired peak wavelength.

In the alkaline earth silicate phosphor, the europium activator substitutes on the alkaline earth lattice site, such that the phosphor may be written as: $(A_{1-x}Eu_x)_2DSi_2O_7$, where $0<x\leq0.2$. The alkaline earth silicate phosphor may also contain other impurities and dopants. For example, the phosphor may contain a small amount of fluorine incorporated during powder processing from a fluorine containing flux compound, such as $BaF_2$ or $EuF_3$.

480 nm and a high efficacy and quantum efficiency for incident radiation having a peak wavelength between 360 and 420 nm. For example, the following two commercially available $Eu^{2+}$ activated phosphors fit this criteria.

One example of a third phosphor having a peak emission wavelength between 420 and 480 nm is the divalent europium activated halophosphate phosphor, DPOCl:$Eu^{2+}$, where D comprises at least one of Sr, Ba, Ca or Mg. The DPOCl:$Eu^{2+}$ phosphor preferably comprises the commercially available "SECA" phosphor, $D_5(PO_4)_3Cl$:$Eu^{2+}$. A small amount of phosphate may be replaced by a small amount of borate to increase the emission intensity. The peak emission wavelength of this phosphor varies with the ratio of strontium to other alkaline earth ions. When D comprises only Sr ions, the peak emission wavelength is 447 nm. Substitution of the Sr ions with Ba ions cause the peak emission to shift to a lower wavelength, while substitution of the Sr ions with Ca ions cause the peak emission to shift to a higher wavelength. For example, if the 0.5 moles out of the 5 moles of Sr ions are substituted with 0.5 moles of Ca ions, then the peak emission shifts to 452 nm. If 1 mole of Sr ions are substituted with 0.5 moles of Ca ions and 0.5 moles of Ba ions, then the peak emission shifts to 445 nm. Therefore, the preferred SECA phosphor composition is $(Sr_{1-y-z}Ba_yC_z)_{5-x}Eu_x(PO_4)_3Cl$, where $0.01 \leq x \leq 0.2$, $0 \leq y \leq 0.1$ and $0 \leq z \leq 0.1$ and the preferred peak emission wavelength is 447–450 nm.

Another example of a third phosphor having a peak emission wavelength between 420 and 480 nm is the divalent europium activated alkaline earth metal aluminate phosphor, $AMgAlO:Eu^{2+}$, where A comprises at least one of Ba, Ca or Sr. The preferred aluminate phosphor may have various magnesium, aluminum and oxygen molar ratios and is commercially available under the name "BAM." For example, one preferred BAM phosphor may be written as $AMg_2Al_{16}O_{27}:Eu^{2+}$, where A preferably comprises at least 90% Ba ions. This phosphor has the following formula: $(Ba_{1-x}Eu_x)Mg_2Al_{16}O_{27}$, where $0<x \leq 0.2$, preferably $x=0.07$. Alternatively, BAM has the following molar ratios: $BaMgAl_{10}O_{17}:Eu^{2+}$. The BAM phosphor has an emission peak at about 450 nm due to the $Eu^{2+}$ activator on the A lattice site. The emission peak shifts from 450 nm to a higher wavelength as the amount of barium ions substituted with strontium ions increases.

Other examples of a third phosphor having a peak emission wavelength between 420 and 480 nm comprise divalent europium activated aluminate phosphors selected from an $EO*AlO:Eu^{2+}$ phosphor, an $EAlO:Eu^{2+}$ phosphor and/or a $GAlO:Eu^{2+}$ phosphor, where E comprises at least one of Ba, Sr or Ca ions and G comprises at least one of K, Li, Na or Rb ions. Preferably, E comprises Ba ions substituted with 0–10% of Sr or Ca ions and G comprises K substituted with 0–10% of Li, Na or Rb ions. Preferably, the $EO*AlO:Eu^{2+}$ phosphor comprises $z(BaO)*6Al_2O_3:Eu^{2+}$ or $z(Ba_{1-x}Eu_x)O*6Al_2O_3$, where $1 \leq z \leq 1.8$, and $0<x \leq 0.2$. The $EAlO:Eu^{2+}$ phosphor preferably comprises $BaAl_{12}O_{19}:Eu^{2+}$ or $(Ba_{1-x}Eu_x)Al_{12}O_{19}$ where $0<x \leq 0.2$. The $GAlO:Eu^{2+}$ phosphor preferably comprises $KAl_{11}O_{11.07}:Eu^{2+}$ or $(K_{1-x}Eu_x)Al_{11}O_{11.07}$, where $0<x \leq 0.2$. The $EO*AlO$, $EAlO$ and $GAlO$ phosphors are described in the following references, each incorporated herein by reference in their entirety: A. L. N. Stevels and A. D. M. Schrama-de Pauw, Journal of the Electrochemical Society, 123 (1976) 691; J. M. P. J. Verstegen, Journal of the Electrochemical Society, 121 (1974) 1623; and C. R. Ronda and B. M. J. Smets, Journal of the Electrochemical Society, 136 (1989) 570.

In one aspect of the present invention, the third phosphor may comprise a blend of SECA, BAM and/or one or more aluminate phosphors in order to optimize the color or other emission properties, if desired.

5. The Optional Fourth Phosphor

The optional fourth luminescent material may be any phosphor, which in response to the incident radiation 2 from the radiation source 1, emits visible light having a peak emission wavelength of about 620 nm to about 670 nm. This red emitting phosphor may be added to the first, second and third phosphors to improve the CRI of the white light emitted by the combination of phosphors. Since the CRI is a measure of how the test colors appear under illumination from the phosphor compared to under illumination from a black body, the white light emitted from phosphor will better approximate the white light from a black body if the phosphor emission comprises additional individual colors. If the radiation source 1 comprises an LED having a peak emission wavelength between 360 and 420 nm, then the second phosphor may comprise any commercially available phosphor having the peak emission wavelength between 620 and 670 nm and a high efficacy and quantum efficiency for incident radiation having a peak wavelength between 360 and 420 nm. For example, the $Mn^{4+}$ activated fluorogermanate phosphor fits this criteria.

For example, the fluorogermanate phosphor may comprise a magnesium fluorogermanate phosphor, $MgO*MgF*GeO:Mn^{4+}$, preferably the commercially available $3.5MgO*0.5MgF_2*GeO_2:Mn^{4+}$ phosphor. This phosphor emits a structured red luminescence band having six peaks at room temperature between 623 and 664 nm.

6. The Phosphor Blend

According to one preferred aspect of the present invention, the first, second, third and optionally fourth phosphors are interspersed. Most preferably, the phosphors are blended together to form a uniform blend. The amount of each phosphor in the blend depends on the type of phosphor and the type of radiation source used. However, the first, second, third and optionally fourth phosphors should be blended such that the combination of the emission 9 from the phosphors appears white to a human observer 8.

Alternatively, the first, second, third and optionally fourth phosphors may comprise discrete layers formed over the radiation source 1. However, the upper phosphor layers should be substantially transparent to the radiation emitted by the lower phosphors.

The composition of the phosphor powder blend may be optimized based on the number of phosphors used, the desired blend CRI and efficacy, the composition of the phosphors and the peak emission wavelength of the radiation source 1. For example, in order to decrease the color temperature of the phosphor blend for a constant excitation radiation wavelength, the ratio of blue to orange emitting phosphors may be decreased. In order to increase the CRI of the phosphor blend, a fourth phosphor, such as a red emitting phosphor, may be added to the blend.

The phosphor blend of a first preferred aspect of the present invention preferably contains at least three phosphors, wherein the white light emitted by the phosphor blend in response to incident or excitation radiation having a peak wavelength between 360 and 420 nm comprises a color temperature between 3000 K and 6500 K, a CRI above 70 and an efficacy of above 200 lm/W. More preferably, the blend efficacy is above 264 lm/W and the color temperature is between 3300 K and 4100 K. Most preferably the efficacy is above 340 lm/W.

The preferred first, second and third phosphors of the first preferred aspect of the invention comprise strontium pyrophosphate, alkali earth silicate and SECA, respectively. The composition of the blend of the first preferred aspect comprises about 55 to about 75 weight percent $Sr_2P_2O_7:Eu^{2+},Mn^{2+}$ phosphor, about 11 to about 22 weight percent $(Ba,Sr,Ca)_2SiO_4:Eu^{2+}$ phosphor and about 13 to about 22 weight percent $(Sr,Ba,Ca,Mg)_5(PO_4)_3Cl:Eu^{2+}$ phosphor.

The high CRI phosphor blend according to a second preferred aspect of the present invention preferably contains at least four phosphors, wherein the white light emitted by the phosphor blend in response to incident radiation having a peak wavelength between 360 and 420 nm comprises a color temperature between 3000 K and 4100 K, a CRI above 90 and an efficacy above 200 lm/W. More preferably, the blend efficacy is above 264 lm/W and the color temperature is between 3300 K and 3800 K.

The preferred first, second, third and fourth phosphors of the second preferred aspect of the invention comprise strontium pyrophosphate, alkali earth silicate, SECA, and magnesium fluorogermanate, respectively. The composition of the blend of the second preferred aspect comprises about 11 to about 43 weight percent $Sr_2P_2O_7:Eu^{2+},Mn^{2+}$ phosphor, about 9 to about 15 weight percent $(Ba,Sr,Ca)_2SiO_4:Eu^{2+}$ phosphor, about 6 to about 14 weight percent $(Sr,Ba,Ca,Mg)_5(PO_4)_3Cl:Eu^{2+}$ phosphor, and about 30 to about 71 weight percent $3.5MgO*0.5MgF_2*GeO_2:Mn^{4+}$ phosphor.

However, other phosphors having the desired peak emission wavelengths may be used instead of or in addition to the phosphors described above. For example, for radiation sources other than LEDs, phosphors that have a high efficacy and high quantum efficiency for incident radiation having a peak wavelength of 254 nm and 147 nm, may be used for fluorescent lamp and plasma display applications, respectively. The mercury gas emission in a fluorescent lamp has a peak emission wavelength of 254 nm and Xe plasma discharge in a plasma display has a peak emission wavelength of 147 nm.

7. The Illumination System

According to the first preferred embodiment of the present invention, the first, second, third and optionally fourth phosphor powders are placed into a white light illumination system containing an LED radiation source. The white light illumination system may have various different structures.

Figure 3:
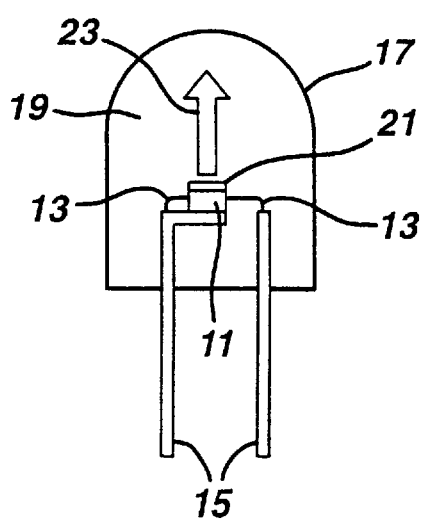
FIGS. 3–5 are cross-sectional schematic views of illumination systems using an LED according to the first preferred embodiment of the present invention.

The first preferred structure is schematically illustrated in FIG. 3. The illumination system includes a light emitting diode chip 11 and leads 13 electrically attached to the LED chip. The leads 13 may comprise thin wires supported by a thicker lead frame(s) 15 or the leads may comprise self supported electrodes and the lead frame may be omitted. The leads 13 provide current to the LED chip 11 and thus cause the LED chip 11 to emit radiation.

The LED chip 11 is encapsulated within a shell 17 which encloses the LED chip and an encapsulant material 19. Preferably, the encapsulant comprises a UV resistant epoxy. The shell 17 may be, for example, glass or plastic. The encapsulant material may be, for example, an epoxy or a polymer material, such as silicone. However, a separate shell 17 may be omitted and the outer surface of the encapsulant material 19 may comprise the shell 17. The LED chip 11 may be supported, for example, by the lead frame 15, by the self supporting electrodes, the bottom of the shell 17 or by a pedestal mounted to the shell or to the lead frame.

The first preferred structure of the illumination system includes a phosphor layer 21 comprising the first, second, third and optionally fourth phosphors. The phosphor layer 21 may be formed over or directly on the light emitting surface of the LED chip 11 by coating and drying a suspension containing the first, second, third and optionally fourth phosphor powders over the LED chip 11. After drying, the phosphor powders form a solid phosphor layer or coating 21. Both the shell 17 and the encapsulant 19 should be transparent to allow white light 23 to be transmitted through those elements. The phosphor emits white light 23 which comprises the orange, blue-green, blue and optionally red light emitted by the first, second, third and optionally fourth phosphors, respectively.

Figure 4:
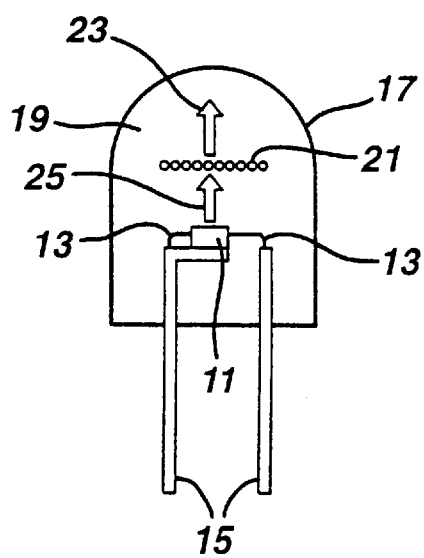

FIG. 4 illustrates a second preferred structure of the system according to the first preferred embodiment of the present invention. The structure of FIG. 4 is the same as that of FIG. 3, except that the phosphor powders are interspersed within the encapsulant material 19, instead of being formed over the LED chip 11. The first phosphor powders may be interspersed within a single region of the encapsulant material 19 or throughout the entire volume of the encapsulant material. The phosphor powders are interspersed within the encapsulant material, for example, by adding the powders to a polymer precursor, and then curing the polymer precursor to solidify the polymer material. Alternatively, the phosphor powders may be mixed in with the epoxy encapsulant. Other phosphor interspersion methods may also be used. The phosphor powders may be premixed prior to adding a mix of these powders to the encapsulant material 19 or the phosphor powders may be added to the encapsulant material 19 separately. Alternatively, a solid phosphor layer 21 comprising the first, second, third and optionally fourth phosphors may be inserted into the encapsulant material 19 if desired. In this structure, the phosphor layer 21 absorbs the radiation 25 emitted by the LED and in response, emits white light 23.

Figure 5:
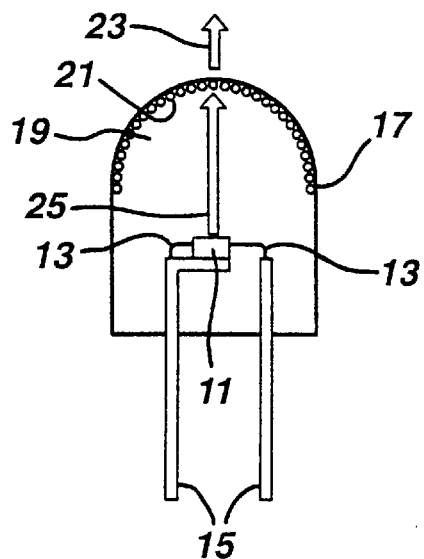

FIG. 5 illustrates a third preferred structure of the system according to the first preferred embodiment of the present invention. The structure of FIG. 5 is the same as that of FIG. 3, except that the phosphor layer 21 containing the first, second, third and optionally fourth phosphors is formed on the shell 17, instead of being formed over the LED chip 11. The phosphor layer 21 is preferably formed on the inside surface of the shell 17, although the phosphor layer 21 may be formed on the outside surface of the shell, if desired. The phosphor layer 21 may be coated on the entire surface of the shell or only a top portion of the surface of the shell 17.

Of course, the embodiments of FIGS. 3–5 may be combined and the phosphor may be located in any two or all three locations or in any other suitable location, such as separately from the shell or integrated into the LED.

Figure 6:
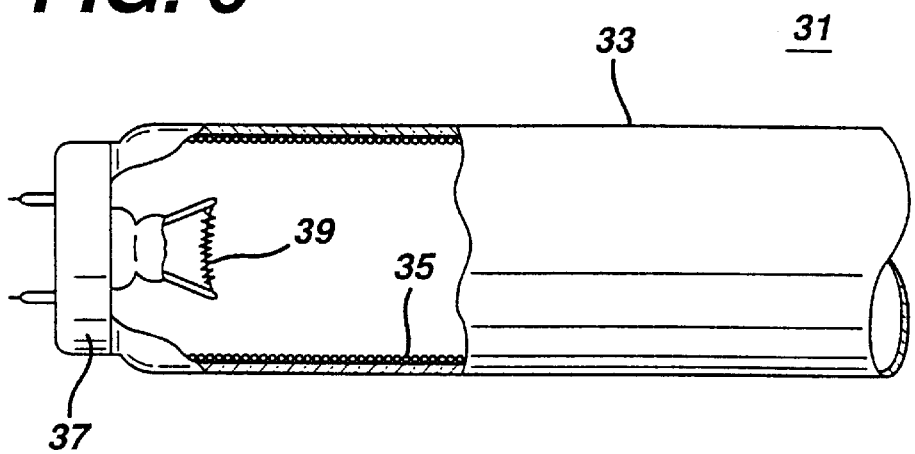
FIG. 6 is a cross-sectional schematic view of an illumination system using a fluorescent lamp according to the second preferred embodiment of the present invention.

According to the second preferred embodiment of the present invention, the first, second, third and optionally fourth powders are placed into a white light illumination system containing a fluorescent lamp radiation source. A portion of a fluorescent lamp is schematically illustrated in FIG. 6. The lamp 31 contains a phosphor coating 35 comprising the first, second, third and optionally fourth phosphors on a surface of the lamp cover 33, preferably the inner surface. The fluorescent lamp 31 also preferably contains a lamp base 37 and a cathode 39. The lamp cover 33 encloses a gas, such as mercury, which emits UV radiation in response to a voltage applied to the cathode 39.

Figure 7:
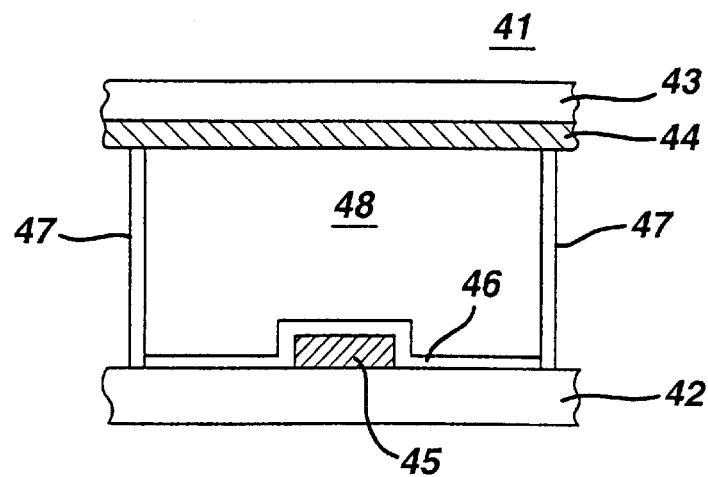
FIG. 7 is a cross-sectional schematic view of an illumination system using a plasma display according to the third preferred embodiment of the present invention.

According to the third preferred embodiment of the present invention, the first, second, third and optionally fourth phosphor powders are placed into a white light illumination system containing a plasma display device. Any plasma display device, such as an AC or a DC plasma display panel may be used, such as the devices described on pages 623–639 of the *Phosphor Handbook*, Edited by S. Shionoya and W. M. Yen, CRC Press, (1987, 1999), incorporated herein by reference. FIG. 7 schematically illustrates one cell of a DC plasma display device 41. The cell contains a first glass plate 42, a second glass plate 43, at least one cathode 44, at least one anode 45, a phosphor layer 46 comprising the first, second, third and optionally fourth phosphors, barrier ribs 47 and a noble gas space 48. In an AC plasma display device, an extra dielectric layer is added between the cathode and the gas space 48. An application of a voltage between the anode 45 and the cathode 44 causes the noble gas in space 48 to emit short wavelength vacuum ultraviolet radiation (VUV), which excites the phosphor layer 46 causing it to emit white light.

8. The Processing Method

The individual phosphors may be made, for example, by any ceramic powder method, such as a wet chemical method or a solid state method.

Preferably, the method of making the first phosphor comprising europium and manganese doped strontium pyrophosphate phosphor comprises the following steps. First, the starting compounds of the first phosphor material are manually blended or mixed in a crucible or mechanically blended or mixed in another suitable container, such as a ball mill, to form a starting powder mixture. The starting compounds may comprise any oxide, phosphate, hydroxide, oxalate, carbonate and/or nitrate starting phosphor compound. The preferred starting phosphor compounds comprise strontium hydrogen phosphate, $SrHPO_4$, manganese carbonate $MnCO_3$, europium oxide, $Eu_2O_3$, and ammonium hydrogen phosphate $(NH_4)HPO_4$ powders. The $(NH_4)HPO_4$ powder is preferably added in an amount comprising 2% in excess of the stoichiometric ratio per mole of the first phosphor produced. A small excess of the Sr compound may also be added if desired. Calcium, barium and magnesium starting compounds may also be added if it is desired to substitute some or all of the strontium with calcium, barium and/or magnesium. The starting powder mixture is then heated in air at about 300 to 800° C. for about 1–5 hours, preferably at 600° C. The resulting powder is then re-blended and subsequently fired in a reducing atmosphere at about 1000 to 1250° C., preferably 1000° C., to form a calcined phosphor body or cake. Preferably the starting powder mixture is calcined in a furnace in an atmosphere comprising nitrogen and 0.1 to 10% hydrogen for four to ten hours, preferably eight hours, and subsequently cooled in the same atmosphere by turning off the furnace.

Preferably, the method of making the second preferred $(Ba,Sr,Ca)_2SiO_4:Eu^{2+}$ phosphor comprises the following steps. First, the starting compounds of the phosphor are manually blended or mixed in a crucible or mechanically blended or mixed in another suitable container, such as a ball mill, to form a starting powder mixture. The starting compounds may comprise any oxide, hydroxide, oxalate, carbonate and/or nitrate starting phosphor compound. The preferred starting phosphor compounds comprise barium carbonate $BaCO_3$, strontium carbonate $SrCO_3$, calcium carbonate $CaCO_3$, europium oxide, $Eu_2O_3$, and silicic acid, $SiO_2*xH_2O$. Preferably, a flux, such as $CaF_2$ is added to the starting materials in an amount of 0.5 to 3 mole percent per mole of the phosphor produced. The starting powder mixture is then fired a first time in a carbon containing atmosphere, such as in a charcoal containing atmosphere at 1200 to 1400° C. for 5 to 7 hours to form a first calcined phosphor body or cake. The resultant cake is then ground and milled to a powder. This powder is then annealed or fired a second time in a reducing atmosphere at about 900 to 1200° C. to form a second calcined phosphor body or cake. Preferably the powder is annealed in a furnace in an atmosphere comprising nitrogen and 0.1 to 10% hydrogen for two to six hours.

The solid calcined phosphor bodies may be converted to a first phosphor powder in order to easily coat the phosphor powder on a portion of the white light illumination system. The solid phosphor body may be converted to the first phosphor powder by any crushing, milling or pulverizing method, such as wet milling, dry milling, jet milling or crushing. Preferably, the solid body is wet milled in propanol, methanol and/or water, and subsequently dried.

The third and fourth phosphors are commercially available as phosphor powders and thus, their exact method of manufacture is not significant. The synthesis of BAM and SECA phosphors is described on pages 398–399 and 416–419 of S. Shionoya et al., *Phosphor Handbook*, CRC Press (1987, 1999), incorporated herein by reference. In general, a method of making a commercial BAM phosphor involves blending starting materials comprising barium carbonate, magnesium carbonate, alumina or aluminum hydroxide, europium oxide and optionally a flux, such as aluminum fluoride or barium chloride. The starting powder mixture is then fired in a reducing atmosphere at about 1200 to 1400° C. to form a calcined phosphor body or cake. The cake may be reground and refired under the same conditions. A method of making a commercial SECA phosphor involves blending starting materials comprising strontium carbonate, strontium orthophosphate, strontium chloride and europium oxide. The starting powder mixture is then fired in a reducing atmosphere at about 1000 to 1200° C. to form a calcined phosphor body or cake. The cake is then ground into a phosphor powder.

The first, second, third and optionally fourth phosphor powders are then blended or mixed together to form a phosphor powder blend or mixture. The powders may be manually blended in a crucible or mechanically blended in another suitable container, such as a ball mill. Of course, the phosphor powder blend may contain more than four powders, if desired. Alternatively, the bodies may be pulverized and blended together.

The phosphor powder blend is then placed into the white light illumination system. For example, the phosphor powder blend may be placed over the LED chip, interspersed into the encapsulant material or coated onto the surface of the shell, as described above with respect to the first preferred embodiment of the present invention.

If the phosphor powder blend is coated onto the LED chip or the shell, then preferably, a suspension of the phosphor powder blend and a liquid is used to coat the LED chip or the shell surface. The suspension may also optionally contain a binder in a solvent. Preferably, the binder comprises an organic material, such as nitrocellulose or ethylcellulose, in a solvent such as butyl acetate or xylol. The binder enhances the adhesion of the powder particles to each other and to the LED or the shell. However, the binder may be omitted to simplify processing, if desired. After coating, the suspension is dried and may be heated to evaporate the binder. The phosphor powder blend acts as the phosphor layer 21 after drying the solvent.

If the phosphor blend is to be interspersed within the encapsulant material 19, then the phosphor blend may be added to a polymer precursor, and then the polymer precursor may be cured to solidify the polymer material. Alternatively, the phosphor blend may be mixed in with the epoxy encapsulant. Other phosphor interspersion methods may also be used.

If the phosphor blend is placed into a fluorescent lamp or a plasma display, then a suspension of the phosphor powder blend and a liquid is used to coat the lamp or plasma display interior surface. The suspension may also optionally contain a binder in a solvent, as described above.

9. Specific Examples

The following examples are merely illustrative, and should not be construed to be any sort of limitation on the scope of the claimed invention.

Example 1

Three blends of three phosphors were prepared by the above mentioned process. The blend composition was varied based on the peak emission wavelength of the radiation source to be used with the blend. In general, for LED radiation sources having a peak emission or excitation wavelength between 370 and 405 nm, the amount of the first orange emitting phosphor in the blend increased while the amount of the second blue-green and third blue emitting phosphors decreased with increasing excitation wavelength. The excitation wavelength, the blend composition, the CIE color coordinates (ccx and ccy), the color temperature, the CRI and the efficacy of the blend are summarized in Table II, below.

TABLE II

| EXCITA-TION λ | PHOSPHOR BLEND (WT %) | ccx | ccy | Color T (K) | CRI | Efficacy (lm/W) |
|---|---|---|---|---|---|---|
| 380 mm | SrP (57.5) BASI (21.5) SECA (21.0) | .4011 | .3807 | 3507 | 70.5 | 346.4 |
| 390 mm | SrP (61.4) BASI (19.4) SECA (19.2) | .3995 | .3830 | 3565 | 70.7 | 347.3 |
| 405 mm | SrP (73.7) BASI (12.1) SECA (14.2) | .3899 | .3791 | 3767 | 72.3 | 349.6 |

In the above table, the following abbreviations were used: BASI=$(Ba_{0.65},Sr_{0.2},Ca_{0.1}Eu_{0.05})_2SiO_4$; SECA=$(Sr,Ba,Ca)_5(PO4)_3Cl:Eu^{2+}$; SrP=$Sr_2P_2O_7:Eu^{2+}Mn^{2+}$. Efficacy is defined as the product of the system luminosity times 683 lm/W, where 683 lm/W is the peak luminosity at 555 nm. System luminosity is defined as $(\int F(\lambda)Y(\lambda)d\lambda)/(\int F(\lambda)d\lambda)$, where $F(\lambda)$ is the emission spectrum and $Y(\lambda)$ is the eye sensitivity curve. As illustrated in Table II, the color temperature of the blends varied from 3507 to 3767 K, the CRI varied from 70.5 to 72.3 and the efficacy varied from 346.4 to 349.6 lm/W. These high efficacy blends are preferred for the white light illumination systems sold in the North American lighting market.

Example 2

Three blends of four phosphors were prepared by the above mentioned process. The blend composition was varied based on the peak emission wavelength of the radiation source to be used with the blend. In general, for LED radiation sources having a peak emission or excitation wavelength between 370 and 405 nm, the amount of the first, second and third phosphors in the blend increased while the amount of the fourth phosphor decreased, with increasing excitation wavelength. The excitation wavelength, the blend composition, the CIE color coordinates (ccx and ccy), the color temperature, the CRI and the efficacy of the blend are summarized in Table III, below.

TABLE III

| EXCITA-TION λ | PHOSPHOR BLEND (WT %) | ccx | ccy | Color T (K) | CRI | Efficacy (lm/W) |
|---|---|---|---|---|---|---|
| 380 mm | SrP (12.7) BASI (10.0) SECA (7.4) MgF (69.9) | .4017 | .3835 | 3519 | 93 | 285 |
| 390 mm | SrP (17.6) BASI (11.8) SECA (9.0) MgF (61.6) | .4065 | .3793 | 3374 | 93.5 | 272.2 |
| 405 mm | SrP (41.5) BASI (14.2) SECA (12.8) MgF (31.5) | .3967 | .3743 | 3557 | 91.3 | 264.7 |

In the above table, the following abbreviations were used: BASI=$(Ba_{0.65},Sr_{0.2},Ca_{0.1}Eu_{0.05})_2SiO_4$; SECA=$(Sr,Ba,Ca)_5(PO4)_3Cl:Eu^{2+}$; SrP=$Sr_2P_2O_7:Eu^{2+}Mn^{2+}$ and MgF=$3.5MgO*0.5MgF_2*GeO_2:Mn^{4+}$. As illustrated in Table III, the color temperature of the blends varied from 3374 to 3557 K, the CRI varied from 91.3 to 93.5 and the efficacy varied from 264.7 to 285 lm/W. From Table III, it is apparent that the addition of the fourth red emitting phosphor results in a significant CRI increase. These high CRI blends are preferred for the white light illumination systems sold in the European lighting market.

The preferred embodiments have been set forth herein for the purpose of illustration. However, this description should not be deemed to be a limitation on the scope of the invention. Accordingly, various modifications, adaptations, and alternatives may occur to one skilled in the art without departing from the spirit and scope of the claimed inventive concept.

What is claimed is:

1. A white light illumination system comprising:
   a light emitting diode;
   a first luminescent material having a peak emission wavelength of about 575 to about 620 nm; and
   a second luminescent material having a peak emission wavelength of about 495 to about 550 nm, which is different from the first luminescent material;
   a third luminescent material having a peak emission wavelength of about 420 to about 480 nm, which is different from the first and second luminescent materials; and
   a fourth luminescent material having a peak emission wavelength of about 620 nm to about 670 nm.

2. The system of claim 1, wherein the white light emitted by the system lacks any significant visible component emitted by the light emitting diode.

3. The system of claim 1, wherein the light emitting diode peak emission wavelength is 360 to 420 nm.

4. The system of claim 3, wherein the light emitting diode comprises an InGaN active layer having a peak emission wavelength is between 370 and 405 nm.

5. The system of claim 1, wherein the radiation emitted by the light emitting diode does not significantly penetrate through the first, second and third luminescent materials.

6. A white light illumination system comprising:
   a light emitting diode;
   a first luminescent material having a peak emission wavelength of about 575 to about 620 nm; and
   a second luminescent material having a peak emission wavelength of about 495 to about 550 nm, which is different from the first luminescent material; and a third luminescent material having a peak emission wavelength of about 420 to about 480 nm, which is different from the first and second luminescent materials, wherein the first luminescent material comprises a first APO:$Eu^{2+}$,$Mn^{2+}$ phosphor, where A comprises at least one of Sr, Ca, Ba or Mg.

7. The system of claim 6, wherein:
the first phosphor comprises $(A_{1-x-y}Eu_xMn_y)_2P_2O_7$;
where A comprises Sr;
$0<x\leq0.2$; and
$0<y\leq0.2$.

8. The system of claim 6, wherein the second luminescent material comprises a second phosphor selected from at least one of:
   a) an ASiO:$Eu^{2+}$ phosphor, where A comprises at least one of Ba, Ca, Sr or Mg;
   b) an ADSiO:$Eu^{2+}$ phosphor, where A comprises at least one of Ba, Ca or Sr and D comprises at least one of Mg or Zn; or
   c) an AAlO:$Eu^{2+}$ phosphor, where A comprises at least one of Ba, Sr or Ca.

9. The system of claim 8, wherein:
the ASiO:$Eu^{2+}$ phosphor comprises an $(A_{1-x}Eu_x)_2SiO_4$ phosphor, where A comprises Ba, Sr and Ca and $0<x\leq0.2$;
the ADSiO:$Eu^{2+}$ phosphor comprises an $(A_{1-x}Eu_x)_2DSi_2O_7$ phosphor, where $0<x\leq0.2$; or
the AAlO:$Eu^{2+}$ phosphor comprises an $(A_{1-x}Eu_x)Al_2O_4$ phosphor, where $0<x\leq0.2$.

10. The system of claim 8, wherein the third luminescent material comprises a third phosphor selected from at least one of:
   d) an AMgAlO:$Eu^{2+}$ phosphor where A comprises at least one of Ba, Ca or Sr;
   e) a DPOCl:$Eu^{2+}$ phosphor where D comprises at least one of Sr, Ba, Ca or Mg;
   f) an EO*AlO:$Eu^{2+}$ phosphor, where E comprises at least one of Ba, Sr or Ca;
   g) an EAlO:$Eu^{2+}$ phosphor, where E comprises at least one of Ba, Sr or Ca; or
   h) GAlO:$Eu^{2+}$ phosphor, where G comprises at least one of K, Li, Na or Rb.

11. The system of claim 10, wherein:
the AMgAlO:$Eu^{2+}$ phosphor comprises $(A_{1-x}Eu_x)Mg_2Al_{16}O_{27}$, where A comprises Ba and $0<x\leq0.2$;
the DPOCl:$Eu^{2+}$ phosphor comprises $(Sr_{1-y-z}Ba_yCa_z)_{5-x}Eu_x(PO_4)_3Cl$, where $0.01\leq x\leq0.2$, $0\leq y\leq0.1$ and $0\leq z\leq0.1$;
the EO*AlO:$Eu^{2+}$ phosphor comprises $z(Ba_{1-x}Eu_x)O*6Al_2O_3$, where $1\leq z\leq1.8$ and $0<x\leq0.2$;
the EAlO:$Eu^{2+}$ phosphor comprises $(Ba_{1-x}Eu_x)Al_{12}O_{19}$, where $0<x\leq0.2$; or
the GAlO:$Eu^{2+}$ phosphor comprises $(K_{1-x}Eu_x)Al_{11}O_{11.07}$, where $0<x\leq0.2$.

12. The system of claim 10, wherein:
the first phosphor, the second and the third phosphor are interspersed in a phosphor blend;
the light emitting diode peak emission wavelength is about 360 to about 420 nm; and
the white light emitted by the phosphor blend in response to incident light emitting diode radiation comprises a color temperature between 3000 K and 6500 K, a CRI above 70 and an efficacy above 300 lm/W.

13. The system of claim 12, wherein the phosphor blend comprises:
about 55 to about 75 weight percent $Sr_2P_2O_7$:$Eu^{2+}$, Mn 2+ phosphor;
about 11 to about 22 weight percent $(Ba,Sr,Ca)_2SiO_4$:$Eu^{2+}$ phosphor; and
about 13 to about 22 weight percent $(Sr,Ba,Ca,Mg)_5(PO_4)_3Cl$:$Eu^{2+}$ phosphor.

14. The system of claim 13, wherein:
the radiation source comprises an LED having a peak emission wavelength of about 405 nm; and
the phosphor blend comprises:
about 73.7 weight percent $Sr_2P_2O_7$:$Eu^{2+}$, $Mn^{2+}$ phosphor;
about 12.1 weight percent $(Ba_{0.65},Sr_{0.2},Ca_{0.1}Eu_{0.05})_2SiO_4$ phosphor; and
about 14.2 weight percent $(Sr,Ba,Ca)_5(PO_4)_3Cl$:$Eu^{2+}$ phosphor.

15. The system of claim 13, wherein:
the radiation source comprises an LED having a peak emission wavelength of about 380 nm; and
the phosphor blend comprises:
about 57.5 weight percent $Sr_2P_2O_7$:$Eu^{2+}$,Mn 2+ phosphor;
about 21.5 weight percent $(Ba_{0.65},Sr_{0.2},Ca_{0.1}Eu_{0.05})_2SiO_4$ phosphor; and
about 21 weight percent $(Sr,Ba,Ca)_5(PO_4)_3Cl$:$Eu^{2+}$ phosphor.

16. The system of claim 13, wherein:
the radiation source comprises an LED having a peak emission wavelength of about 390 nm; and
the phosphor blend comprises:
about 61.4 weight percent $Sr_2P_2O_7$:$Eu^{2+}$,Mn $^{2+}$ phosphor;
about 19.4 weight percent $(Ba_{0.65},Sr_{0.2},Ca_{0.1}Eu_{0.05})_2SiO_4$ phosphor; and
about 19.2 weight percent $(Sr,Ba,Ca)_5(PO_4)_3Cl$:$Eu^{2+}$ phosphor.

17. The system of claim 12, further comprising:
a shell containing a light emitting diode;
an encapsulating material between the shell and the light emitting diode; and wherein:
   a) the phosphor blend is coated over a surface of the light emitting diode;
   b) the phosphor blend is interspersed in the encapsulating material; or
   c) the phosphor blend is coated onto the shell.

18. The system of claim 10, further comprising a fourth phosphor comprising $3.5MgO*0.5MgF_2*GeO_2$:$Mn^{4+}$.

19. The system of claim 18, wherein:
the first phosphor, the second, the third phosphor and the fourth phosphor are interspersed in a phosphor blend;
the light emitting diode peak emission wavelength is about 360 to about 420 nm; and
the white light emitted by the phosphor blend in response to incident light emitting diode radiation comprises a color temperature between 3000 K and 4100 K, a CRI above 90 and an efficacy of above 200 lm/W.

20. The system of claim 19, wherein the phosphor blend comprises:
about 11 to about 43 weight percent $Sr_2P_2O_7$:$Eu^{2+}$,Mn $^{2+}$ phosphor;
about 9 to about 15 weight percent $(Ba,Sr,Ca)_2SiO_4$:$Eu^{2+}$ phosphor;

about 6 to about 14 weight percent $(Sr,Ba,Ca,Mg)_5$ $(PO_4)_3Cl:Eu^{2+}$ phosphor; and about 30 to about 71 weight percent $3.5MgO*0.5MgF_2*GeO_2:Mn^{4+}$ phosphor.

21. The system of claim 20, wherein:

the radiation source comprises an LED having a peak emission wavelength of about 380 nm; and the phosphor blend comprises:
 about 12.7 weight percent $Sr_2P_2O_7:Eu^{2+}$, $Mn^{2+}$ phosphor;
 about 10 weight percent $(Ba_{0.65},Sr_{0.2},Ca_{0.1}Eu_{0.05})_2SiO_4$ phosphor;
 about 7.4 weight percent $(Sr,Ba,Ca)_5(PO_4)_3Cl:Eu^{2+}$ phosphor; and
 about 69.9 weight percent $3.5MgO*0.5MgF_2*GeO_2:Mn^{4+}$.

22. The system of claim 20, wherein:

the radiation source comprises an LED having a peak emission wavelength of about 390 nm; and the phosphor blend comprises:
 about 17.6 weight percent $Sr_2P_2O_7:Eu^{2+}$, $Mn^{2+}$ phosphor;
 about 11.8 weight percent $(Ba_{0.65},Sr_{0.2},Ca_{0.1}Eu_{0.05})_2SiO_4$ phosphor;
 about 9 weight percent $(Sr,Ba,Ca)_5(PO_4)_3Cl:Eu^{2+}$ phosphor; and
 about 61.6 weight percent $3.5MgO*0.5MgF_2*GeO_2:Mn^{4+}$.

23. The system of claim 20, wherein:

the radiation source comprises an LED having a peak emission wavelength of about 405 nm; and the phosphor blend comprises:
 about 41.5 weight percent $Sr_2P_2O_7:Eu^{2+}$, $Mn^{2+}$ phosphor;
 about 14.2 weight percent $(Ba_{0.65},Sr_{0.2},Ca_{0.1}Eu_{0.05})_2SiO_4$ phosphor;
 about 12.8 weight percent $(Sr,Ba,Ca)_5(PO_4)_3Cl:Eu^{2+}$ phosphor; and
 about 31.5 weight percent $3.5MgO*0.5MgF_2*GeO_2:Mn^{4+}$.

24. A white light illumination system, comprising:

a radiation source;

a first $APO:Eu^{2+},Mn^{2+}$ phosphor, where A comprises at least one of Sr, Ca, Ba or Mg;

a second phosphor selected from at least one of:
 a) an $ASiO:Eu^{2+}$ phosphor, where A comprises at least one of Ba, Ca, Sr or Mg;
 b) an $ADSiO:Eu^{2+}$ phosphor, where A comprises at least one of Ba, Ca or Sr and D comprises at least one of Mg or Zn; or
 c) an $AAlO:Eu^{2+}$ phosphor, where A comprises at least one of Ba, Sr or Ca; and a third phosphor selected from at least one of:
 d) an $AMgAlO:Eu^{2+}$ phosphor where A comprises at least one of Ba, Ca or Sr; or
 e) a $DPOCl:Eu^{2+}$ phosphor where D comprises at least one of Sr, Ba, Ca or Mg;
 f) an $EO*AlO:Eu^{2+}$ phosphor, where E comprises at least one of Ba, Sr or Ca;
 g) an $EAlO:Eu^{2+}$ phosphor, where E comprises at least one of Ba, Sr or Ca; or
 h) $GAlO:Eu^{2+}$ phosphor, where G comprises at least one of K, Li, Na or Rb.

25. The system of claim 24, wherein:

the first phosphor comprises $(A_{1-x-y}Eu_xMn_y)_2P_2O_7$, where A comprises Sr, $0<x\leq0.2$ and $0<y\leq0.2$;

the $ASiO:Eu^{2+}$ phosphor comprises an $(A_{1-x}Eu_x)_2SiO_4$ phosphor, where A comprises Ba, Sr and Ca and $0<x\leq0.2$;

the $ADSiO:Eu^{2+}$ phosphor comprises an $(A_{1-x}Eu_x)_2DSi_2O_7$ phosphor, where $0<x\leq0.2$;

the $AAlO:Eu^{2+}$ phosphor comprises an $(A_{1-x}Eu_x)Al_2O_4$ phosphor, where $0<x\leq0.2$;

the $AMgAlO:Eu^{2+}$ phosphor comprises $(A_{1-x}Eu_x)Mg_2Al_{16}O_{27}$, where A comprises Ba and $0<x\leq0.2$;

the $DPOCl:Eu^{2+}$ phosphor comprises $(Sr_{1-y-z}Ba_yCa_z)_{5-x}Eu_x(PO_4)_3Cl$, where $0.01\leq x\leq0.2$, $0\leq y\leq0.1$ and $0\leq z\leq0.1$;

the $EO*AlO:Eu^{2+}$ phosphor comprises $z(Ba_{1-x}Eu_x)O*6Al_2O_3$, where $1\leq z\leq1.8$, and $0<x\leq0.2$;

the $EAlO:Eu^{2+}$ phosphor comprises $(Ba_{1-x}Eu_x)Al_{12}O_{19}$, where $0<x\leq0.2$; or the $GAlO:Eu^{2+}$ phosphor comprises $(K_{1-x}Eu_x)Al_{11}O_{11.07}$, where $0<x\leq0.2$; and further comprising a fourth $3.5MgO*0.5MgF_2*GeO_2:Mn^{4+}$ phosphor.

26. The system of claim 25, wherein:

the illumination system comprises an LED lamp, a fluorescent lamp or a plasma display; and the radiation source comprises an LED chip or a gas contained in the fluorescent lamp or a plasma display.

* * * * *

UNITED STATES PATENT AND TRADEMARK OFFICE
CERTIFICATE OF CORRECTION

PATENT NO.    : 6,621,211 B1
DATED         : September 16, 2003
INVENTOR(S)   : Alok M. Srivastava et al.

It is certified that error appears in the above-identified patent and that said Letters Patent is hereby corrected as shown below:

<u>Column 1,</u>
Line 7, cancel "70NANB4022" and substitute -- 70NANB8H4022 --.

Signed and Sealed this

Second Day of December, 2003

JAMES E. ROGAN
*Director of the United States Patent and Trademark Office*